United States Patent
Dirscherl

(10) Patent No.: US 9,620,674 B2
(45) Date of Patent: Apr. 11, 2017

(54) OPTOELECTRONIC COMPONENT AND METHOD FOR THE PRODUCTION THEREOF

(71) Applicant: OSRAM Opto Semiconductors GmbH, Regensburg (DE)

(72) Inventor: Georg Dirscherl, Tegernheim (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 14/783,049

(22) PCT Filed: Apr. 14, 2014

(86) PCT No.: PCT/EP2014/057523
§ 371 (c)(1),
(2) Date: Oct. 7, 2015

(87) PCT Pub. No.: WO2014/173719
PCT Pub. Date: Oct. 30, 2014

(65) Prior Publication Data
US 2016/0049547 A1  Feb. 18, 2016

(30) Foreign Application Priority Data

Apr. 25, 2013  (DE) .................. 10 2013 104 195

(51) Int. Cl.
*H01L 29/10* (2006.01)
*H01L 33/10* (2010.01)
(Continued)

(52) U.S. Cl.
CPC .............. *H01L 33/10* (2013.01); *H01L 33/28* (2013.01); *H01L 33/56* (2013.01); *H01L 33/44* (2013.01);
(Continued)

(58) Field of Classification Search
CPC ......... H01L 33/10; H01L 33/28; H01L 33/56; H01L 33/644; H01L 33/44; H01L 2933/005
(Continued)

(56) References Cited

U.S. PATENT DOCUMENTS 5,427,713 A * 6/1995 Wartenberg ............ C09K 19/54
252/299.01
5,643,471 A * 7/1997 Onishi ................ G02F 1/13394
216/23
(Continued)

FOREIGN PATENT DOCUMENTS

DE  102010012385 A1  9/2011
DE  102010027253 A1  1/2012
(Continued)

OTHER PUBLICATIONS

Xin et al., "Study of Tetrapodal ZnO-PDMS Composites: A Comparison of Fillers Shapes in Stiffness and Hydrophobicity Improvements".*
(Continued)

*Primary Examiner* — Eva Y Montalvo
*Assistant Examiner* — Mohammad M Hoque
(74) *Attorney, Agent, or Firm* — Slater Matsil, LLP

(57) ABSTRACT

A method for producing an optoelectronic component includes creating a first layer of a polymer material. The method also includes applying crystals to a surface of the first layer. The method also includes creating a second layer of a polymer material on the surface of the first layer. The crystals can be between the first and second layers.

14 Claims, 4 Drawing Sheets

(51) Int. Cl.
*H01L 33/56* (2010.01)
*H01L 33/28* (2010.01)
*H01L 33/44* (2010.01)
*H01L 33/64* (2010.01)

(52) U.S. Cl.
CPC ...... *H01L 33/644* (2013.01); *H01L 2933/005* (2013.01)

(58) Field of Classification Search
USPC .......................................................... 257/43
See application file for complete search history.

(56) References Cited

U.S. PATENT DOCUMENTS

| | | |
|---|---|---|
| 8,860,062 B2 | 10/2014 | Schneider et al. |
| 2003/0189830 A1 | 10/2003 | Sugimoto et al. |
| 2004/0013856 A1* | 1/2004 | Araki ................ B32B 3/30 428/167 |
| 2006/0091410 A1* | 5/2006 | Chen ................ H01L 33/642 257/95 |
| 2006/0091796 A1* | 5/2006 | Shirogane ........ H01L 27/3239 313/506 |
| 2012/0018754 A1* | 1/2012 | Lowes ................ F21K 9/135 257/98 |
| 2012/0320298 A1* | 12/2012 | Suzuki ............ G02F 1/133553 349/43 |
| 2013/0207145 A1 | 8/2013 | Schneider et al. |
| 2013/0264602 A1* | 10/2013 | Namiki ................ H01L 33/60 257/98 |
| 2014/0027807 A1* | 1/2014 | Tasaki ................ H01L 33/58 257/98 |
| 2014/0139794 A1* | 5/2014 | Ohnishi ............ G02F 1/133788 349/123 |
| 2015/0146131 A1* | 5/2015 | Satoh ................ G02F 1/1337 349/61 |

FOREIGN PATENT DOCUMENTS

| | | |
|---|---|---|
| EP | 1178544 A2 | 2/2002 |
| WO | 2012121021 A1 | 9/2012 |

OTHER PUBLICATIONS

Jin, X., et al., "Joining the Un-joinable: Adhesion Between Low Surface Energy Polymers Using Tetrapodal ZnO Linkers," Advanced Materials, vol. 24, Aug. 24, 2012, pp. 5676-5680.

\* cited by examiner

OPTOELECTRONIC COMPONENT AND METHOD FOR THE PRODUCTION THEREOF This patent application is a national phase filing under section 371 of PCT/EP2014/057523, filed Apr. 14, 2014, which claims the priority of German patent application 10 2013 104 195.7, filed Apr. 25, 2013, each of which is incorporated herein by reference in its entirety.

TECHNICAL FIELD

The present invention relates to a method for producing an optoelectronic component and to an optoelectronic component.

BACKGROUND

German Patent Publication DE 102010027253 A1 describes an optoelectronic component. A counterpart U.S. application was published as US 2013/0207145.

SUMMARY

Embodiments of the invention provide a method for producing an optoelectronic component. Further embodiments provide an optoelectronic component.

The method described here can be used in particular to produce an optoelectronic component as described here. That is to say that all of the features disclosed for the method are also disclosed for the optoelectronic component, and vice versa.

Polymer materials may be used in a wide variety of ways in the optoelectronic components described here. For example, silicones may be used as housing material, as encapsulation material and for the production of lenses. Many polymer materials, however, exhibit low adhesion. As a result, peeling of silicone layers or separation of assembled silicone layers may take place. Delamination of silicon layers may also take place as a result of the effects of temperature, mechanical stress or moisture.

It is possible to treat silicone surfaces with plasma, for example, oxygen plasma, in order to make the silicone surfaces reactive. However, such plasma activation lasts only a short time before it needs to be repeated. Furthermore, plasma treatment may lead to chemical modification of a silicone surface, which may cause degradation of the silicone.

A method for producing an optoelectronic component comprises steps of producing a first layer of a polymer material, applying crystals onto a surface of the first layer, and producing a second layer of a polymer material on the surface of the first layer. Advantageously, the crystals applied onto the surface of the first layer act as an anchor between the first layer and the second layer. In this way, improved adhesion by anchoring is obtained between the first layer and the second layer. Advantageously, this does not require any chemical modification, and therefore also no degradation, of the surface of the first layer. A further advantage may consist in improved thermal conduction between the first layer and the second layer.

In one embodiment of the method, the crystals have a concave shape. Advantageously, the crystals can then lead to particularly effective anchoring between the first layer and the second layer.

In one embodiment of the method, the crystals are applied before curing of the material of the first layer. Advantageously, the crystals may then partially sink into the material of the first layer so that particularly effective anchoring between the first layer and the second layer can be obtained.

In one embodiment of the method, the second layer is produced before curing of the material of the first layer. Advantageously, by common curing of the material of the first layer and of the material of the second layer, a particularly durable bond between the first layer and the second layer can be achieved.

In one embodiment of the method, the crystals are applied by simple scattering. In this way, the method can advantageously be carried out particularly simply and economically.

In one embodiment of the method, the crystals are applied without using a dispersion additive. The method can also advantageously be carried out particularly simply and economically in this way.

An optoelectronic component comprises a first layer of a polymer material and a second layer of a polymer material. In this case, the first layer and the second layer adjoin one another. Crystals are arranged in a contact region between the first layer and the second layer. Advantageously, the crystals lead to anchoring between the first layer and the second layer, so that there is improved adhesion of the second layer on the first layer. In this way, delamination of the second layer from the first layer can advantageously be prevented. Advantageously, no chemical modification, and therefore also no degradation of the surface of the first layer, is necessary for this. Another advantage may consist in improved thermal conduction between the first layer and the second layer.

In one embodiment of the optoelectronic component, the crystals have a concave shape. Advantageously, the crystals can then lead to particularly effective anchoring of the second layer on the first layer.

In one embodiment of the optoelectronic component, the first layer and/or the second layer consists of a silicone. Advantageously, a low adhesion of silicone can be compensated for by the crystals arranged between the first layer and the second layer.

In one embodiment of the optoelectronic component, the first layer and/or the second layer consists of polytetrafluoroethylene. Advantageously, a low adhesion of polytetrafluoroethylene can be compensated for by the crystals arranged between the first layer and the second layer.

In one embodiment of the optoelectronic component, the first layer and/or the second layer consists of a polyphthalamide (PPA), an epoxy-based thermoset, polyester or another polymer material. Advantageously, a low adhesion of the polymer material can be compensated for by the crystals arranged between the first layer and the second layer.

According to at least one embodiment of the method, the first layer and the second layer are respectively formed with the same polymer material. In this case, it is possible for the two layers to additionally comprise fillers which differ from the polymer material. The layers may in this case also comprise different fillers to one another. For example, it is possible for the first layer to contain radiation-scattering and/or radiation-reflecting particles. The second layer may, for example, contain radiation-converting particles or, for instance, a luminescent conversion substance.

It is in this way possible in particular that the first layer and the second layer, even though they are formed with the same polymer material, may have different thermal expansion coefficients to one another. That is to say, owing to the fact that in at least one of the layers a filler is used which is not present in the other layer, or scarcely present therein, the layers have different thermal expansion coefficients.

In this case, in particular, it is possible for the two layers to contain silicone as polymer material or to consist of silicone.

The method described here, and the optoelectronic component described here, are based inter alia on the discovery that different filler particles in different layers modify the thermal properties of the layers, in particular the thermal expansion coefficient. For this reason, it is possible that layers which are formed with the same basic polymer material, for example, silicone, may have a different thermal expansion behavior. It has now been shown that the crystals described here, in particular crystals that have a concave shape, can also lead to better adhesion of such layers to one another, so that the crystals lead to reduced induction of delamination under cyclic loading, i.e., with alternating temperatures, in the contact region of the two layers.

According to at least one embodiment of the method, the first layer is filled with radiation-scattering and/or radiation-reflecting particles, which make the first layer appear white or colored. The second layer is nominally free of filler particles or is filled with particles of a conversion material. For example, the first layer may laterally enclose an optoelectronic semiconductor chip, and be for example, flush with the upper side of the latter. The second layer, which may be in direct contact with the first layer, may then be applied onto the first layer and the optoelectronic semiconductor chip. In this way, for example, it is possible to enclose the optoelectronic semiconductor chip with a radiation-reflecting or colored body, which is formed by the first layer. The second layer, into which, for example, a luminescent conversion material that converts the wavelength of at least a part of the electromagnetic radiation generated during operation by the semiconductor chip is introduced, is then formed on the radiation exit surface of the semiconductor chip. In this way, for example, colored or white mixed light may be emitted from the optoelectronic component produced in this way.

According to at least one embodiment of the method, at least a large part of the crystals is enclosed locally by material of the first layer and locally by material of the second layer. This can be achieved by applying the crystals onto the as yet uncured material of the first layer. The crystals then sink partly, but not fully, into the material of the first layer. The second layer may, for example, be applied before the curing of the material of the first layer. The material of the second layer also encloses the part of the crystals protruding from the first layer, so that the crystals are locally in direct contact with the material of the first layer and locally with the material of the second layer, and are respectively enclosed by the latter. During the curing of the two layers, volume changes of the layers may then also occur. For example, the volume of the layers shrinks, which additionally leads to even stronger engagement with the crystals. In this context, "at least a large part of the crystals" means that at least 50% of the crystals applied are enclosed by material of the layers and are locally in direct contact with material of the two layers. In this case, it is possible for the proportion of the crystals which sink fully into the first layer to be adjusted by means of the time before the second layer is applied as well as by means of the viscosity of the first layer.

In one embodiment of the optoelectronic component, the crystals have an average size of less than 0.5 mm, preferably less than 0.2 mm. Such a small size of the crystals advantageously allows arrangement of a multiplicity of crystals between the first layer and the second layer, even in the case of optoelectronic components having small spatial dimensions.

In one embodiment of the optoelectronic component, the crystals consist of zinc oxide. Zinc oxide crystals are advantageously suitable for the production of mechanical anchoring by hooking.

In one embodiment of the optoelectronic component, the crystals are configured as tetrapods. Advantageously, the four branches of the crystals then lead to particularly effective anchoring between the first layer and the second layer. Such crystals are described in a different context in the publication X. Jin, J. Streuben, L. Heepe, A. Kovalev, Y. K. Mishra, R. Adelung, Adv. Mater. 2012, which is expressly included here by reference.

In one embodiment of the optoelectronic component, optically reflective particles are embedded in the material of the first layer. Advantageously, the first layer may then be used as an optical reflection layer of the optoelectronic component.

In one embodiment of the optoelectronic component, the second layer forms an optical lens of the optoelectronic component. Advantageously, the lens may lead to collimation of electromagnetic radiation emitted by the optoelectronic component.

BRIEF DESCRIPTION OF THE DRAWINGS

The properties, features and advantages of this invention as described above, and the way in which they are achieved, will become more clearly and readily comprehensible in conjunction with the following description of the exemplary embodiments, which will be explained in more detail in connection with the drawings. In schematic representations.

DETAILED DESCRIPTION OF ILLUSTRATIVE EMBODIMENTS

Figure 1:
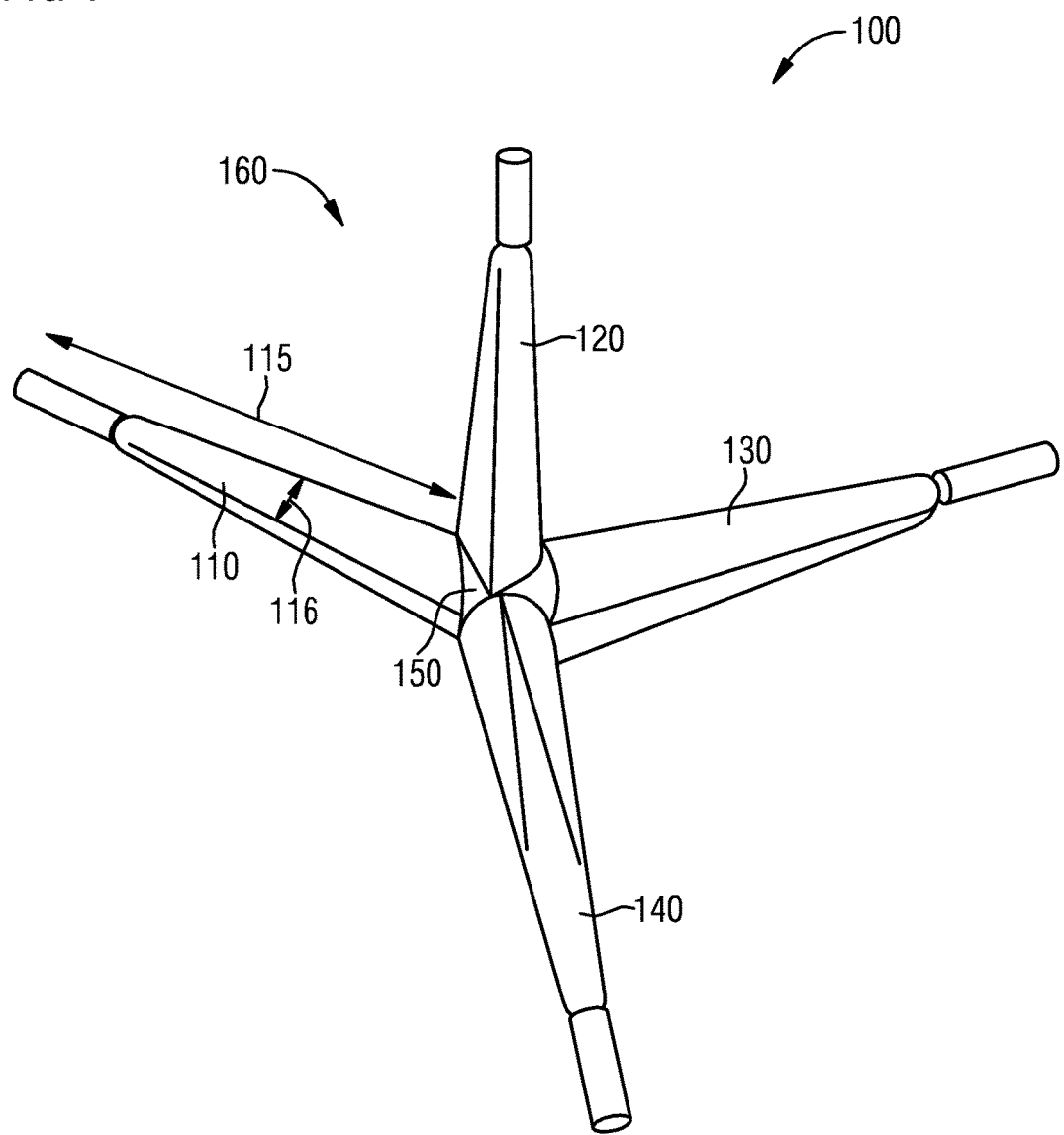
FIG. 1 shows a perspective representation of a crystal.

FIG. 1 shows a perspective representation of a crystal 100. The crystal 100 represented by way of example is a zinc oxide crystal in the form of a tetrapod. The crystal 100 could, however, also be replaced with a crystal consisting of a different material and/or be replaced with a different shape.

The crystal 100 configured in the form of a tetrapod has a first branch 110, a second branch 120, a third branch 130 and a fourth branch 140. The first branch 110, the second branch 120, the third branch 130 and the fourth branch 140 extend from a common center 150 to the vertices of an imaginary tetrahedron.

Each of the four branches 110, 120, 130, 140 has a branch length 115. The branch length 115 may, for example, lie in the range of between 10 µm and 100 µm. Each of the branches 110, 120, 130, 140 has an average branch diameter 116. The branch diameter 116 may, for example, lie between 1 µm and 10 µm. This leads to an overall dimension of the crystal 100 of less than 0.5 mm, preferably less than 0.2 mm. The crystal 100 may, however, also be configured to be smaller or larger.

The crystal 100 configured in the form of a tetrapod has a concave shape. An imaginary concave envelope 160 may be placed around the first branch 110, the second branch 120, the third branch 130 and the fourth branch 140 of the crystal 100. If the crystal 100 consisting of zinc oxide is replaced with an alternative crystal, then the alternative crystal preferably also has a concave shape.

Figure 2:
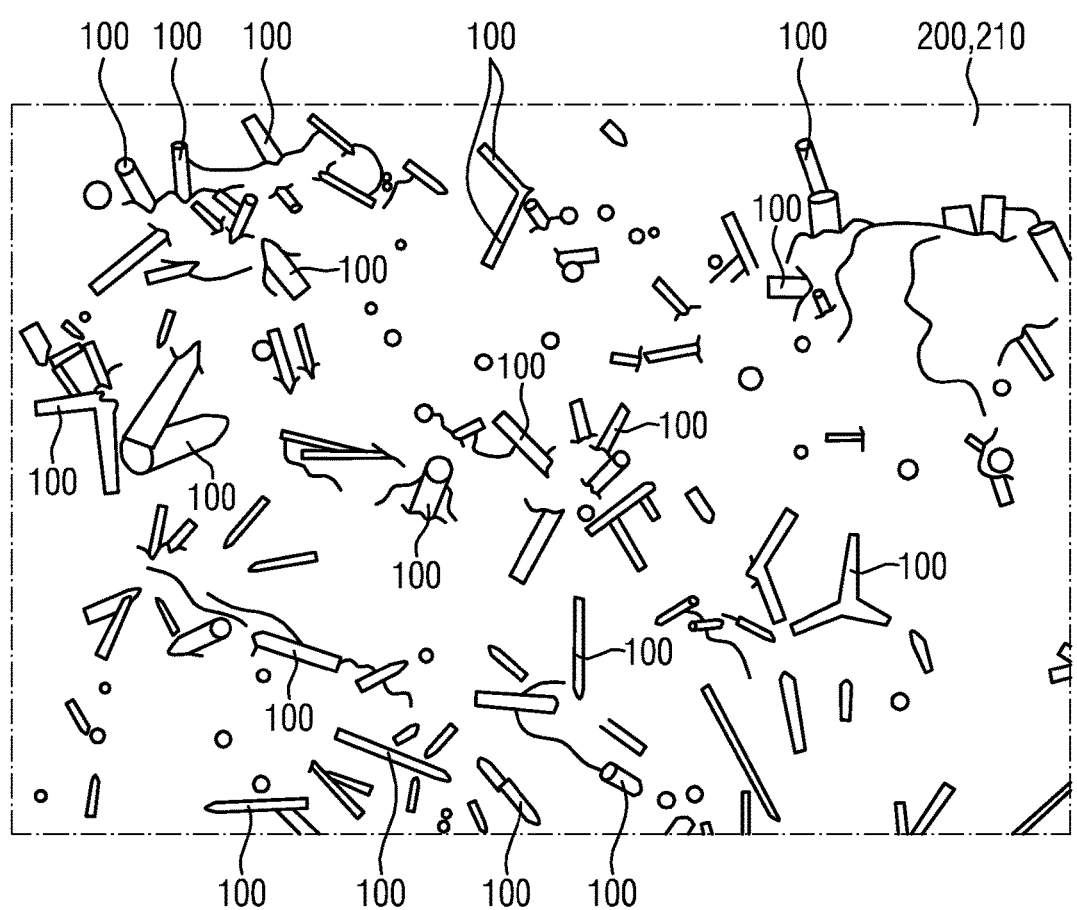
FIG. 2 shows a surface of a polymer layer with crystals partially sunk therein.

FIG. 2 shows a plan view of a surface 210 of a polymer layer 200. The polymer layer 200 consists of a polymer material. For example, the polymer layer 200 may consist of a silicone. The polymer layer 200 may, for example, also consist of polytetrafluoroethylene (PTFE), a polyphthalamide (PPA), an epoxy-based thermoset, polyester or another polymer material. The material of the polymer layer 200 was applied in liquid form. The material of the polymer layer 200 is subsequently cured.

A multiplicity of the crystals 100 represented in FIG. 1 were applied onto the surface 210 of the polymer layer 200. The crystals 100 on the surface 210 of the polymer layer 200 have partially sunk into the material of the polymer layer 200 on the surface 210 of the polymer layer 200. Some branches 110, 120, 130, 140 of the crystals 100 protrude at the surface 210 out of the material of the polymer layer 200. Other branches 110, 120, 130, 140 of the crystals 100 are arranged inside the polymer layer 200. In this way, the crystals 100 are anchored in the polymer layer 200.

The crystals 100 were preferably applied onto the surface 210 of the polymer layer 200 before full curing of the material of the polymer layer 200. This facilitates partial sinking of the crystals 100 into the polymer layer 200.

The crystals 100 were preferably scattered onto the surface 210 of the polymer layer 200. The scattering of the crystals 100 onto the surface 210 of the polymer layer 200 may be carried out without a dispersion additive.

In a subsequent process step, a further layer of a polymer material may be applied onto the surface 210 of the polymer layer 200. The branches 110, 120, 130, 140, which protrude beyond the surface 210 of the polymer layer 200, of the crystals 100 arranged on the surface 210 of the polymer layer 200 are in this case embedded in the polymer material of the further layer and therefore anchored in the further layer. At the same time, the crystals 100 are partially embedded in the material of the polymer layer 200 and therefore anchored in the polymer layer 200. In this way, the crystals 100 lead to adhesion, achieved by anchoring or hooking, between the polymer layer 200 and the further layer of polymer material.

Preferably, the further layer of polymer material is applied onto the surface 210 of the polymer layer 200 before the polymer material of the polymer layer 200 is fully cured. This processing may be referred to as wet-wet processing. The polymer layer 200 and the further layer of the polymer material may then be cured together, so that particularly effective adhesion is achieved between the polymer layer 200 and the further layer of polymer material, arranged on the surface 210 of the polymer layer 200.

Figure 3:
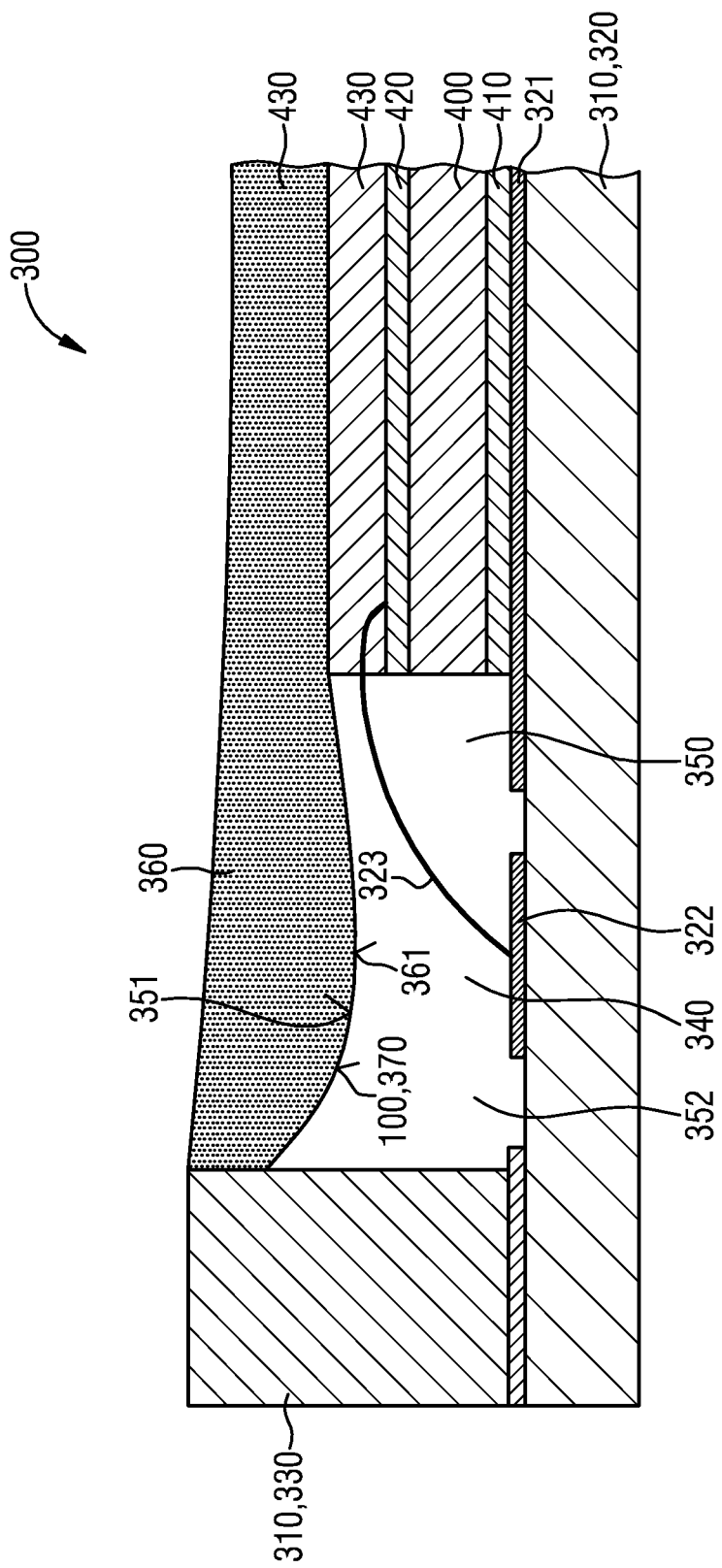
FIG. 3 shows a sectional representation of a part of an optoelectronic component according to a first embodiment.

FIG. 3 shows a schematic sectional representation of a part of an optoelectronic component 300. The optoelectronic component 300 may, for example, be a light-emitting diode component.

The optoelectronic component 300 has a housing 310. The housing 310 comprises a bottom 320 and a circumferential delimiting ring 330 arranged on an upper side of the bottom 320. The bottom 320 and/or the delimiting ring 330 of the housing 310 may consist of a ceramic material. For example, the bottom 320 and/or the delimiting ring 330 of the housing 310 may consist of AlN.

In the region above the bottom 320 bounded laterally by the delimiting ring 330, the housing 310 of the optoelectronic component 300 has an internal space 340. In the region of the internal space 340, a first contact surface 321 and a second contact surface 322 are arranged on the upper side of the bottom 320. The first contact surface 321 and the second contact surface 322 respectively consist of an electrically conductive material.

The optoelectronic component 300 furthermore comprises an optoelectronic semiconductor chip 400. The optoelectronic semiconductor chip 400 may, for example, be a light-emitting diode chip (LED chip). The optoelectronic semiconductor chip 400 is arranged above the first contact surface 321 in the internal space 340 of the housing 310 of the optoelectronic component 300. Provided between the first contact surface 321 and the optoelectronic semiconductor chip 400, there is a lower connecting layer 410. The lower connecting layer 410 may, for example, be configured to be electrically conductive. The lower connecting layer 410 may, for example, be formed by a solder connection.

In the example of the optoelectronic component 300 as represented, a conversion layer 430, which is connected by means of an upper connecting layer 420 to the optoelectronic semiconductor chip 400, is arranged on an upper side of the optoelectronic semiconductor chip 400, on the opposite side from the bottom 320 of the housing 310. The conversion layer 430 may, for example, consist of a silicone. The conversion layer 430 may be used in order to convert a wavelength of electromagnetic radiation emitted by the optoelectronic semiconductor chip 400. To this end, wavelength-converting particles may be embedded in the converting layer 430. The upper connecting layer 420 may be omitted.

Extending between the upper side of the optoelectronic semiconductor chip 400 and the second contact surface 322 on the bottom 320 of the housing 310, there is a bonding wire 323 which establishes an electrically conductive connection between the optoelectronic semiconductor chip 400 and the second contact surface 322.

Arranged in a region, extending externally around the optoelectronic semiconductor chip 400, of the internal space 340 of the housing 310 of the optoelectronic component 300, there is a reflector layer 350. The reflector layer 350 is bounded by the delimiting ring 330 of the housing 310, the bottom 320 of the housing 310, and the optoelectronic semiconductor chip 400. An upper side 351, facing away from the bottom 320 of the housing 310, of the reflector layer 350 is approximately flush with an upper side of the conversion layer 430.

The reflector layer 350 may consist of a silicone. Optically reflective particles 352 are embedded in the reflector layer 350. The particles 352 embedded in the material of the reflector layer 350 may, for example, consist of $TiO_2$. The bonding wire 323 is embedded in the reflector layer 350, so that protection of the bonding wire 323 from mechanical damage is obtained.

Arranged above the upper side 351 of the reflector layer 350 and above the conversion layer 430, there is an encapsulation layer 360 in the internal space 340 of the housing 310 of the optoelectronic component 300. The encapsulation layer 360 is used as mechanical protection for the reflector layer 350 and the conversion layer 430. The encapsulation layer 360 may consist of a silicone.

A lower side 361 of the encapsulation layer 360 adjoins the upper side 351 of the reflector layer 350. A contact region 370 is therefore formed between the upper side 351 of the reflector layer 350 and the lower side 361 of the encapsulation layer 360. A multiplicity of crystals 100 are arranged in the contact region 370. Preferably, the crystals 100 are embedded partially in the reflector layer 350 and partially in the encapsulation layer 360. The crystals 100 arranged in the contact region 370 lead to adhesion, generated by anchoring, between the reflector layer 350 and the encapsulation layer 360, as explained with reference to FIG. 2. The crystals 100 arranged in the contact region 370 between the reflector layer 350 and the encapsulation layer 360 therefore improve the adhesion of the encapsulation layer 360 on the reflector layer 350 and prevent delamination between the reflector layer 350 and the encapsulation layer 360.

The crystals 100 were preferably already applied onto the upper side 351 of the reflector layer 350 before the curing of the reflector layer 350. Subsequently, the encapsulation layer 360 was preferably already applied onto the upper side 351 of the reflector layer 350 before the curing of the reflector layer 350.

Crystals 100 may also be arranged in the region between the conversion layer 430 and the encapsulation layer 360 and increase adhesion between the conversion layer 430 and the encapsulation layer 360.

Figure 4:
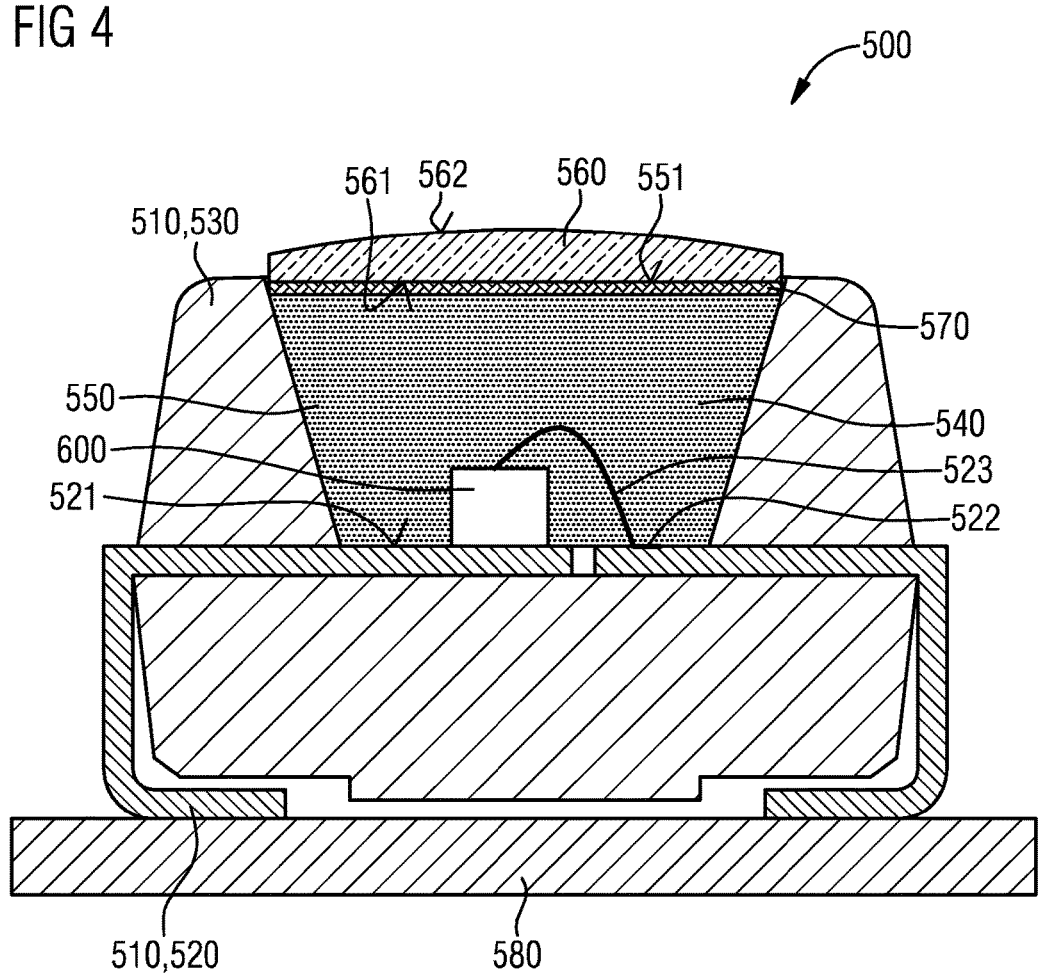
FIG. 4 shows a sectional representation of an optoelectronic component according to a second embodiment.

FIG. 4 shows a schematic sectional representation of an optoelectronic component 500 according to a second embodiment. The optoelectronic component 500 may, for example, be a light-emitting diode component.

The optoelectronic component 500 has a housing 510 being only represented schematically in FIG. 4. The housing 510 comprises a bottom 520. A first section of the bottom 520 forms a first electrical contact surface 521. A second section of the bottom 520 forms a second electrical contact surface 522. The housing 510 of the optoelectronic component 500 furthermore comprises a delimiting ring 530, which is arranged on an upper side of the bottom 520 and circumferentially bounds an internal space 540 of the housing 510. The housing 510 of the optoelectronic component 500 is arranged on a carrier 580 being represented only schematically in FIG. 4.

In the internal space 540 of the housing 510 of the optoelectronic component 500, an optoelectronic semiconductor chip 600 is arranged on the first contact surface 521 of the bottom 520. The optoelectronic semiconductor chip 600 may, for example, be an LED chip. The optoelectronic semiconductor chip 600 is electrically conductively connected to the second contact surface 522 by means of a bonding wire 523.

The internal space 540 of the housing 510 of the optoelectronic component 500 is filled with an encapsulation layer 550, in which the optoelectronic semiconductor chip 600 and the bonding wire 523 are embedded. The encapsulation layer 550 is used for mechanical protection of the optoelectronic semiconductor chip 600 and of the bonding wire 523. The encapsulation layer 550 may, for example, consist of a silicone and was introduced in liquid form into the internal space 540 of the housing 510. An upper side 551 of the encapsulation layer 550 is approximately flush with an upper side of the delimiting ring 530 of the housing 510.

A lens 560 is arranged on the upper side 551 of the encapsulation layer 550 of the optoelectronic component 500. The lens 560 is used as the optical lens and may, for example, be used for collimation of electromagnetic radiation emitted by the optoelectronic semiconductor chip 600. To this end, an outer side 562, facing away from the encapsulation layer 550, of the lens 560 is configured to be convex in the example represented.

The lens 560 may, for example, consist of silicone and was applied in liquid form onto the upper side 551 of the encapsulation layer 550. A lower side 561 of the lens 560 faces toward the upper side 551 of the encapsulation layer 550. A contact region 570 is formed at the boundary between the upper side 551 of the encapsulation layer 550 and the lower side 561 of the lens 560. A multiplicity of crystals 100 which lead to adhesion, achieved by hooking or anchoring, between the encapsulation layer 550 and the lens 560, as explained with reference to FIG. 2, are arranged in the contact region 570. The branches 110, 120, 130, 140 of the crystals 100 arranged in the contact region 570 are embedded partially in the encapsulation layer 550 and partially in the lens 560. In this way, the crystals 100 hold the lens 560 on the encapsulation layer 550.

Preferably, the crystals 100 were applied by scattering onto the upper side 551 of the encapsulation layer 550. Preferably, the crystals 100 were already applied onto the upper side 551 of the encapsulation layer 550 before full curing of the encapsulation layer 550. The lens 560 was subsequently applied onto the upper side 551 of the encapsulation layer 550. Preferably, the application of the lens 560 also already took place before full curing of the encapsulation layer 550. The encapsulation layer 550 and the lens 560 are subsequently cured together.

The invention has been illustrated and described in detail with the aid of the preferred exemplary embodiments. Nevertheless, the invention is not restricted to the examples disclosed. Rather, other variants may be derived therefrom by the person skilled in the art without departing from the protective scope of the invention.

The invention claimed is:

1. A method for producing an optoelectronic component, the method comprising:
   forming a first layer of a polymer material;
   applying crystals onto a surface of the first layer; and
   forming a second layer of a polymer material on the surface of the first layer,
   wherein the crystals have a concave shape,
   wherein the first layer and the second layer are formed with the same polymer material,
   wherein the crystals are applied before any curing of the material of the first layer,
   wherein the second layer is formed before any curing of the material of the first layer,
   wherein the first layer and the second layer have different thermal expansion coefficients to one another,
   wherein a majority of the crystals are enclosed locally by the material of the first layer and locally by the material of the second layer, and
   wherein a majority of the crystals locally directly adjoin the first layer and the second layer.

2. The method according to claim 1, wherein the crystals are scattered onto the surface of the first layer.

3. The method according to claim 1, wherein the crystals are applied without using a dispersion additive.

4. An optoelectronic component comprising:
   a first layer of a polymer material;
   a second layer of a polymer material that adjoins the first layer; and
   crystals arranged in a contact region between the first layer and the second layer,
   wherein a majority of the crystals are enclosed locally by the material of the first layer and locally by the material of the second layer,
   wherein a majority of the crystals locally directly adjoin the first layer and the second layer, and
   wherein the first layer and the second layer locally adjoin each other.

5. The optoelectronic component according to claim 4, wherein the crystals each have a concave shape.

6. The optoelectronic component according to claim 4, further comprising an optoelectronic semiconductor chip, wherein the first layer or the second layer directly adjoins the optoelectronic semiconductor chip.

7. The optoelectronic component according to claim 4, wherein the first layer or the second layer consists essentially of a silicone.

8. The optoelectronic component according to claim 4, wherein the first layer or the second layer consists essentially of polytetrafluoroethylene.

9. The optoelectronic component according to claim 4, wherein the crystals have an average size of less than 0.5 mm.

10. The optoelectronic component according to claim 9, wherein the crystals have an average size of less than 0.2 mm.

11. The optoelectronic component according to claim 4, wherein the crystals consist essentially of zinc oxide.

12. The optoelectronic component according to claim 4, wherein the crystals are configured as tetrapods.

13. The optoelectronic component according to claim 4, wherein optically reflective particles are embedded in the material of the first layer.

14. The optoelectronic component according to claim 4, wherein the second layer forms an optical lens of the optoelectronic component.

* * * * *